(12) United States Patent
Tsai

(10) Patent No.: US 6,759,350 B2
(45) Date of Patent: Jul. 6, 2004

(54) METHOD FOR IMPROVING CONTACT HOLE PATTERNING

(75) Inventor: Yaw-Ming Tsai, Tai-Chung Hsien (TW)

(73) Assignee: Toppoly Optoelectronics Corp., Miao-Li Hsien (TW)

( * ) Notice: Subject to any disclaimer, the term of this patent is extended or adjusted under 35 U.S.C. 154(b) by 0 days.

(21) Appl. No.: 10/065,780

(22) Filed: Nov. 18, 2002

(65) Prior Publication Data

US 2004/0018656 A1 Jan. 29, 2004

(30) Foreign Application Priority Data

Jul. 25, 2002 (TW) ......................................... 91116634 A

(51) Int. Cl.[7] ............................................ H01L 21/469
(52) U.S. Cl. .................... 438/787; 438/788; 438/694; 438/700; 438/637; 438/640; 438/30; 349/41; 349/110; 349/158; 349/139
(58) Field of Search ................................. 438/787, 788, 438/694, 700, 702, 976, 637, 638, 639, 640, 30; 349/41–43, 110, 138–151, 158

(56) References Cited

U.S. PATENT DOCUMENTS 5,185,601 A * 2/1993 Takeda et al. .............. 340/784
2001/0041455 A1 * 11/2001 Yun et al. ................... 438/745

* cited by examiner

*Primary Examiner*—Mathew Smith
*Assistant Examiner*—Renzo Rocchegiani
(74) *Attorney, Agent, or Firm*—Winston Hsu

(57) ABSTRACT

An LCD panel is provided, the LCD panel having a substrate, a conductive layer positioned on the substrate, and a dielectric layer disposed on the surface of the conductive layer. First, a photoresist layer with an opening is formed on the dielectric layer. An etching process is then performed to form a contact hole along the opening. After that, a post treatment process is performed to form a protective layer to reduce damage on the conductive layer when the photoresist layer is stripped.

34 Claims, 7 Drawing Sheets

US 6,759,350 B2

METHOD FOR IMPROVING CONTACT HOLE PATTERNING

BACKGROUND OF INVENTION

1. Field of the Invention

The present invention relates to a method for improving contact hole patterning, and more particularly, to a method of fabricating a contact hole with a post treatment process.

2. Description of the Related Art

Since a liquid crystal display (LCD) has the advantages of portability, low power consumption, and low radiation, the LCD has been widely used in various portable information products, such as notebooks, personal digital assistants (PDA), etc. The LCD is gradually replacing the cathode ray tube (CRT) monitors of the conventional desktop computers. Among all kinds of LCDs, the thin film transistor liquid crystal display (TFT-LCD), which can drive pixels disposed on the liquid crystal display panel with an active matrix driving method, is therefore a major focus.

In the fabricating process of the thin film transistor, an inter-layer dielectric (ILD) layer is disposed between the transistor and the metal layer thereon for isolating and protecting the electrical elements on the LCD panel. A plurality of contact holes are formed in the ILD layer so that the metal layer can be filled into the contact holes to electrically connect with the transistor or other electrical elements. Therefore, data signals can be transmitted to a source and a drain of the transistor through the metal layer inside the contact hole for controlling the operation of pixels in the LCD panel.

Please refer to FIG. 1 to FIG. 3, which are schematic diagrams of a method of fabricating a contact hole in an LCD panel 10 according to prior art. As shown in FIG. 1, the LCD panel 10 comprises a substrate 12, a conductive layer 14 disposed on the surface of the substrate 12, and a dielectric layer positioned on the conductive layer 14. The LCD panel 10 can further comprises other electrical elements, such as a plurality of gate structures of driving transistors (not shown). The conductive layer 14 serves as a source or a drain of the driving transistor. The dielectric layer 16 is used for isolating the driving transistor from other electric elements and providing a plane surface for the following process. In the conventional method of fabricating a contact hole, a lithography process is first performed, to form a photoresist layer 18 on the dielectric layer 16. The photoresist layer 18 comprises an opening 20 extending through to the surface of the dielectric layer 16 for defining the pattern and the position of the contact hole.

As shown in FIG. 2, an etching process, such as a dry etching process or a wet etching process, is followed by using the photoresist layer 18 as a mask layer to remove parts of the dielectric layer 16 along the opening 20 and form a contact hole 22 extending to the surface of the conductive layer 14. As shown in FIG. 3, after the photoresist layer 18 is stripped, a conductive material, such as a doped polysilicon or a metal layer, is filled into the contact hole 22 to form a conductive trace or a contact plug for electric connection of the driving transistor or other electric elements on the LCD panel 10.

Since each driving transistor on the LCD panel 10 corresponds to a pixel, the electrical performance of each driving transistor determines the uniformity of the LCD panel 10 display. For improving the display performance of the LCD panel 10, a base solution with amine is used as a photoresist stripper (PR stripper) to remove the photoresist layer 18 on the LCD panel 10 uniformly so as to avoid the pollution caused by the residual photoresist layer 18. However, the conductive layer 14 in the bottom of the contact hole 22 is exposed to the amine-contained stripper when the photoresist layer is stripped. As a result, damage on the surface of the conductive layer 14 occurs very frequently. These will all result in point defects, which deteriorate the stability of data transmission and affect the reliability of products.

SUMMARY OF INVENTION

It is therefore a primary objective of the claimed invention to provide a method of forming a contact hole on an LCD panel which comprises a post treatment process to form a protective layer on the conductive layer to solve the problem mentioned above.

In a preferred embodiment of the claimed invention, an LCD panel comprises a substrate, a conductive layer disposed on the surface of the substrate, and a dielectric layer positioned on the substrate. First, a photoresist layer is formed on the dielectric layer. The photoresist layer comprises an opening extending through to the surface of the dielectric layer. Then, an etching process is performed to remove parts of the dielectric layer along the opening to form a contact hole extending to the surface of the conductive layer. A post treatment process is followed to form a protective layer on the conductive layer. After the photoresist layer is stripped, the protective layer is removed and a conductive trace electrically connected to the conductive layer through the contact hole is formed on the dielectric layer.

It is an advantage of the claimed invention that a post treatment process is performed to form a protective layer on the conductive layer to prevent the conductive layer from being exposed to amine-contained stripper. Therefore, the method of the claimed invention prevents damage on the conductive layer sufficiently and thereby improves the reliability of the products in advance.

These and other objectives of the claimed invention will not doubt become obvious to those of ordinary skill in the art after reading the following detailed description of the preferred embodiment, which is illustrated in the various figures and drawings.

DETAILED DESCRIPTION

Figure 1:
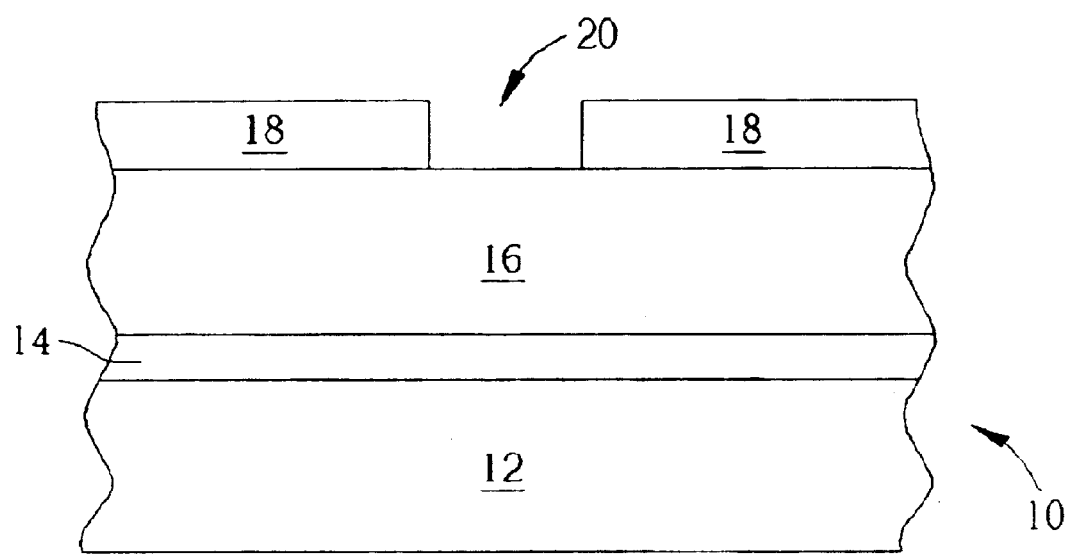
FIG. 1 to FIG. 3 are schematic diagrams of a method of fabricating a contact hole according to prior art.
Figure 2:
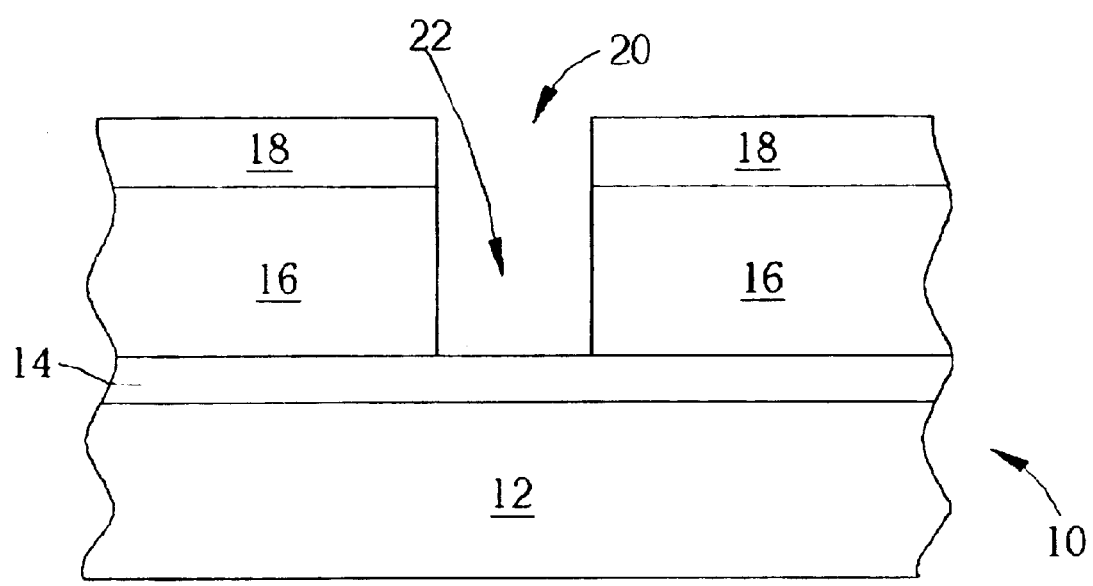
Figure 3:
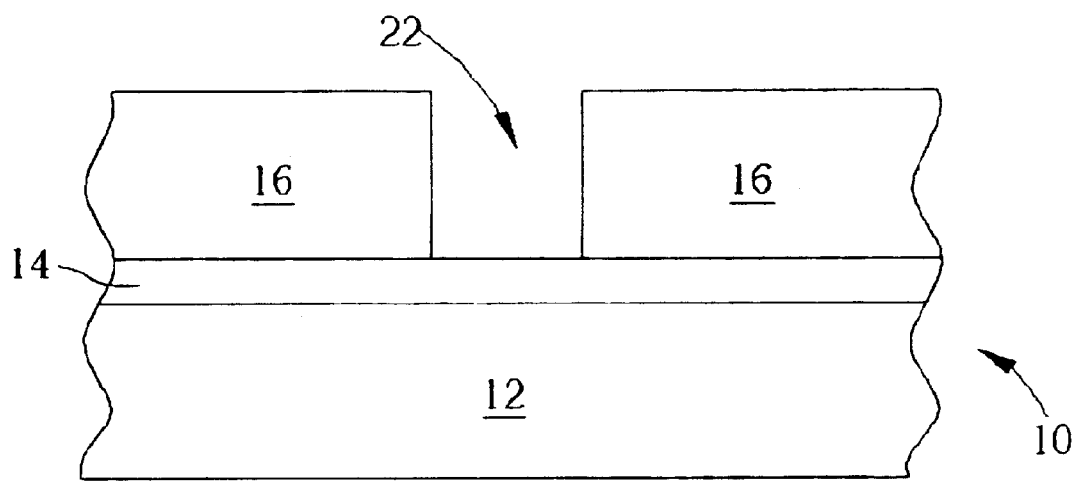
Figure 4:
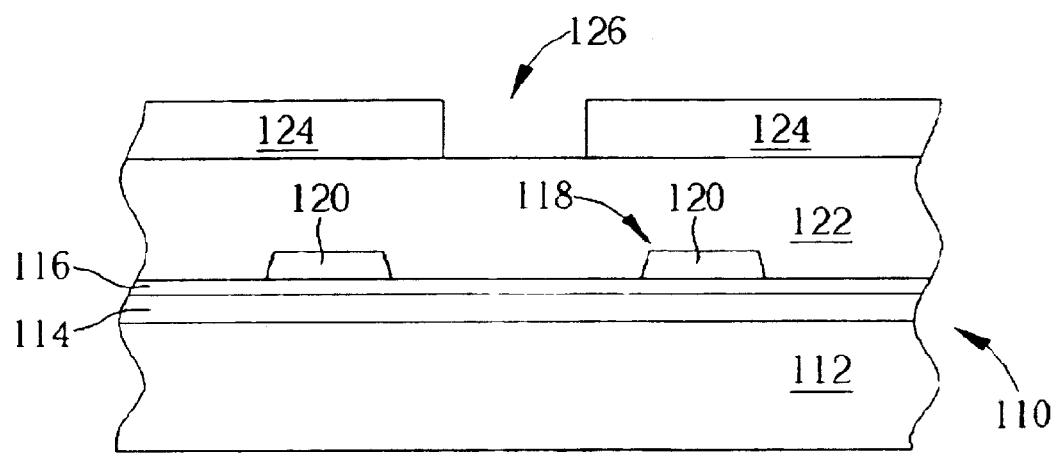
FIG. 4 to FIG. 7 are schematic diagrams of a method of fabricating a contact hole according to the present invention.

Please refer to FIG. 4 to FIG. 7 of schematic diagrams of fabricating a contact hole on an LCD panel 110 according to the present invention. As shown in FIG. 4, the LCD panel 110 comprises a substrate 112, a plurality of transistors 118 disposed on the surface of the substrate 112, and an inter layer dielectric (ILD) layer 122 covering the transistors 118. Each of the transistors 118 is used as a driving transistor and comprises a metal gate 120 disposed on the surface of the substrate 112, a conductive layer 114 functioned as a source or drain positioned under the metal gate 120, and a gate oxide layer 116 positioned between the conductive layer 114 and the metal gate 120. In the preferred embodiment of the present invention, the substrate 112 comprises a silicon substrate or a glass substrate. The conductive layer 114 is made of a polysilicon layer or a doped polysilicon layer. The ILD layer 122 is composed of a dielectric layer such as a silicon nitride layer or a silicon oxide layer. In the method of the present invention, a lithography process is first performed to form a photoresist layer 124 on the ILD layer 122. The photoresist layer 124 comprises an opening 126 extending through to the surface of the ILD layer 122 to define the position and pattern of the contact hole.

Figure 5:
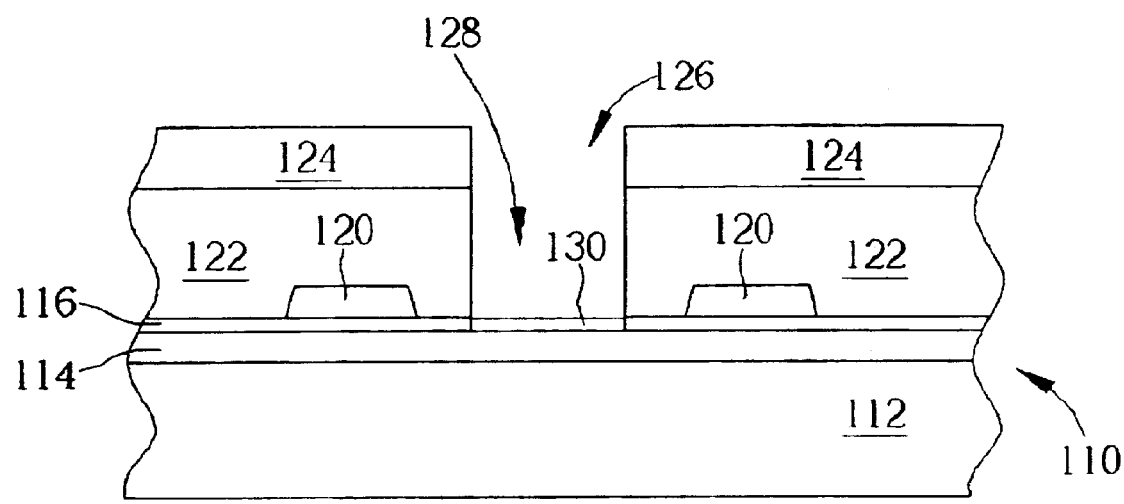

As shown in FIG. 5, an etching process, such as a dry etching or a wet etching, is performed by using the photoresist layer 124 as a mask layer to remove parts of the ILD layer 122 to form a contact hole 129 extending to the surface of the conductive layer 114. After that, a post treatment process is performed to form a protective layer 130 under the contact hole 128 covering on the surface of the conductive layer 114. The thickness of the protective layer 130 is less than 100 angstroms. In the preferred embodiment of the present invention, the thickness of the protective layer 130 is about 50 angstroms.

In the preferred embodiment of the present invention, the post treatment process entails involves using UV light or excimer UV light to irradiate the LCD panel 110 so as to form an oxide layer on the surface of the conductive layer 114 to achieve the purpose of forming the protective layer 130. It is important that the purpose of the post treatment process is to form the protective layer 130 so as to prevent the conductive layer 114 from being exposed in the following process. Therefore, the post treatment process is not limited to the UV light irradiation mentioned above, but can be performed by different processes to form the protective layer 130 on the surface of the conductive layer 114 according to the requirements of the manufacturing process. For example, the post treatment process can be performed by using an ozone solution to wash the surface of the conductive layer 114, utilizing a thermal oxidation process or an oxygen-contained plasma to oxidize the surface of the conductive layer 114, or exposing the conductive layer 114 to the atmosphere environment for more than 6 hours to oxidize the surface of the conductive layer 114 so as to form the protective layer 130.

In addition, the post treatment process can be integrated with other processes in advance to simplify the manufacturing process and reduce the fabrication cost. For example, when a dry etching process is used to form the contact hole 128, the oxygen plasma can be added to the etching plasma used in the dry etching process so that the contact hole 128 and the protective layer 130 can be formed simultaneously.

Figure 6:
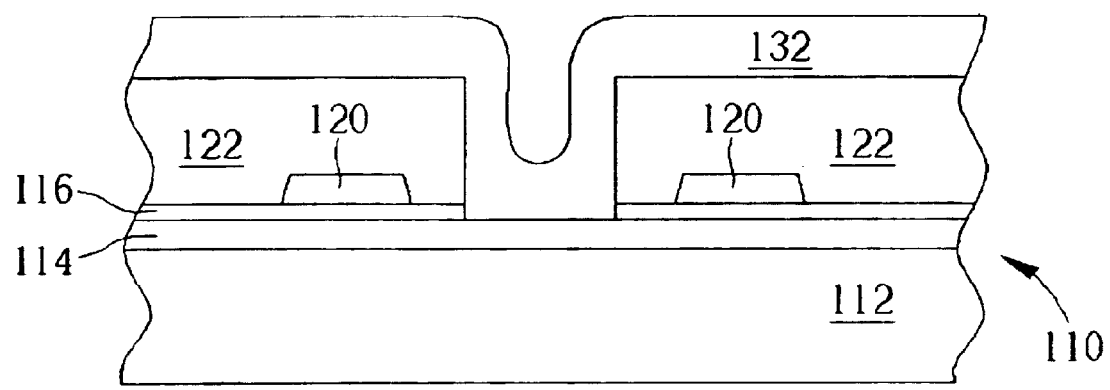
Figure 7:
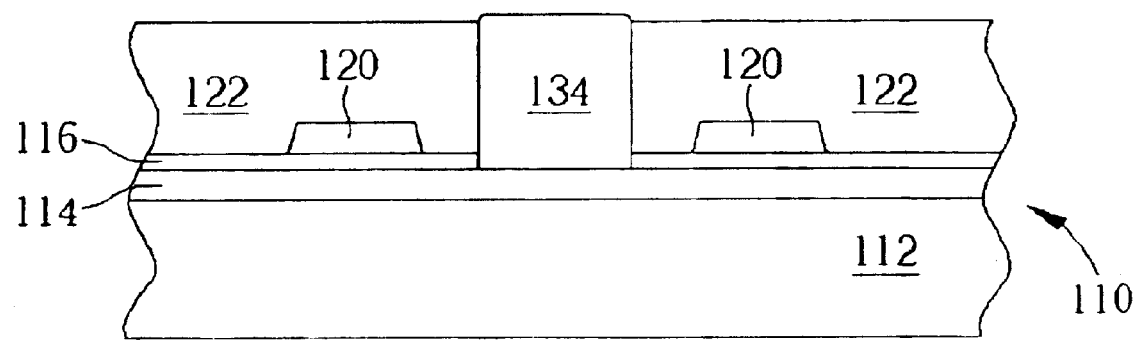

As shown in FIG. 6, a base PR stripper such as an amine-containing base solution is used to wash the LCD panel 110 and strip the photoresist layer 124 on the LCD panel 110. After the photoresist layer is stripped, the protective layer 130 is removed. Then, a conductive material is deposited on the ILD layer 122. Parts of the conductive material is filled into the contact hole 128 and electrically connected to the conductive layer 124. Notice that the electrical connection can be made in different ways, as shown in FIG. 6 and FIG. 7. As shown in FIG. 6, a conductive trace 132 made of a conductive material is formed on ILD layer 122. Parts of the conductive trace 132 is filled into the contact hole 128 and electrically connected to the transistor 118. The conductive trace 132 serves as a data bus line for data transmission. Regarding FIG. 7, a contact plug 134 is formed inside the contact hole 128 by using a CVD process to deposit a conductive material into the contact hole 128. Therefore, the contact plug 134 can be used for the electrical connection with external circuits in advance. In the preferred embodiment of the present invention, a dilute HF solution is used to remove the protective layer 130, followed by a CVD process to form the conductive trace 132. However, the present invention is not limited to the aforementioned process. Some other processes can be used to achieve the same purpose as the aforementioned process according to the requirements of the manufacturing process. For example, a spluttering process can be used to remove the protective layer 130 and form the conductive trace 132 or the contact plug 134 simultaneously.

The present invention comprises a step of performing a post treatment process to form a protective layer 130 on the conductive layer 114 after the contact hole 128 is formed. As a result, the damage on the conductive layer 114 caused by the base PR stripper during the stripping process can be avoided. In addition, although the aforementioned embodiment is focused on fabricating a contact hole on an LCD panel, it should be noted that the method of fabricating a contact hole according to the present invention can be applied to other fields in which contact holes are formed. For example, the method according to the present invention can be used to form a contact hole in a semiconductor wafer, and more particularly, in a semiconductor wafer with a metal layer which needs to strip the photoresist layer for defining the contact holes by using the base solution.

In contrast with the prior art method of fabricating a contact hole, the present invention comprises a post treatment process after forming the contact hole so that a protective layer can be formed before the photoresist layer is stripped. As a result, the problem of the conductive layer being damaged by the base PR stripper in the conventional method can be avoided. In another words, the present invention improves the contact hole patterning sufficiently and increases the reliability of products and the stability of data transmission through the contact plug or conductive trace inside the contact hole.

Those skilled in the art will readily observe that numerous modifications and alterations of the invention may be made while retaining the teachings of the invention. Accordingly, the above disclosure should be construed as limited only by the metes and bounds of appended claims.

What is claimed is:

1. A method for improving contact hole patterning in a liquid crystal display (LCD) panel, the liquid crystal display panel comprising a substrate, a conductive layer positioned on the substrate surface, and a dielectric layer disposed on the conductive layer, the method comprising the following steps:

forming a photoresist layer on the dielectric layer, the photoresist layer having an opening extending through to the surface of the dielectric layer;

performing an etching process to remove parts of the dielectric layer along the opening to form a contact hole extending to the surface of the conductive layer;

performing a post treatment process to form a protective layer under the contact hole covering the surface of the conductive layer; and stripping the photoresist layer with a base solution.

2. The method of the claim 1 wherein the method further comprises removing the protective layer after stripping the photoresist layer.

3. The method of the claim 1 wherein the method forms a data bus line on the dielectric layer after stripping the photoresist layer, and parts of the data bus line are filled into the contact hole and electrically connected to the conductive layer.

4. The method of the claim 1 wherein a contact plug is formed in the contact hole after stripping the photoresist layer.

5. The method of the claim 4 wherein the contact plug is used to electrically connect a driving transistor and a data bus line of the liquid crystal display panel.

6. The method of the claim 1 wherein the etching process is a dry etching process.

7. The method of the claim 1 wherein the etching process is a wet etching process.

8. The method of the claim 1 wherein the post treatment process comprises radiating the surface of the conductive layer with ultraviolet (UV) light.

9. The method of the claim 1 wherein the post treatment process comprises washing the surface of the conductive layer with an ozone solution to form the protective layer.

10. The method of the claim 1 wherein the post treatment process is a thermal oxidation process.

11. The method of the claim 1 wherein the post treatment process comprises exposing the conductive layer to the atmosphere for at least 6 hours to oxidize the surface of the conductive layer and form the protective layer.

12. The method of the claim 1 wherein the post treatment process comprises oxidizing the surface of the conductive layer with oxygen plasma to form the protective layer.

13. The method of the claim 1 wherein the conductive layer is a polysilicon layer.

14. The method of the claim 1 wherein the conductive layer is an amorphous silicon layer.

15. The method of the claim 1 wherein the protective layer is a silicon oxide layer.

16. The method of the claim 1 wherein the protective layer is used to protect the conductive layer from damage while the photoresist layer is stripped.

17. The method of the claim 1 wherein the conductive layer is used as a source or a drain of a driving transistor of the liquid crystal display panel.

18. The method of the claim 1 wherein the thickness of the protective layer is less than 100 angstroms.

19. A method for improving contact hole patterning in a semiconductor wafer, the semiconductor wafer comprising a substrate, a conductive layer positioned on the substrate surface, and a dielectric layer disposed on the conductive layer, the method comprising the following steps:

forming a photoresist layer on the dielectric layer, the photoresist layer having an opening extending through to the surface of the dielectric layer;

performing an etching process to remove parts of the dielectric layer along the opening to form a contact hole extending to the surface of the conductive layer;

performing a post treatment process to form a protective layer under the contact hole covering the surface of the conductive layer; and stripping the photoresist layer with a base solution.

20. The method of the claim 19 wherein the method further comprises removing the protective layer after removing the photoresist layer.

21. The method of the claim 19 wherein the method forms a data bus line on the dielectric layer after stripping the photoresist layer, and parts of the data bus line are filled into the contact hole and electrically connected to the conductive layer.

22. The method of the claim 19 wherein a contact plug is formed in the contact hole after stripping the photoresist layer.

23. The method of the claim 19 wherein the method further comprises forming a gate on the semiconductor wafer before forming the photoresist layer.

24. The method of the claim 19 wherein the gate is a metal gate.

25. The method of the claim 19 wherein the etching process is a dry etching process.

26. The method of the claim 19 wherein the etching process is a wet etching process.

27. The method of the the claim 19 wherein the post treatment process comprises radiating the surface of the conductive layer with ultraviolet (UV) light to form the protective layer.

28. The method of the claim 19 wherein the post treatment process comprises washing the surface of the conductive layer with an ozone solution to form the protective layer.

29. The method of the claim 19 wherein the post treatment process is a thermal oxidation process.

30. The method of the claim 19 wherein the post treatment process comprises oxidizing the surface of the conductive layer with oxygen plasma to form the protective layer.

31. The method of the claim 19 wherein the post treatment process comprises exposing the conductive layer to the atmosphere for at least 6 hours to oxidize the surface of the conductive layer and form the protective layer.

32. The method of the claim 19 wherein the conductive layer is a polysilicon layer.

33. The method of the claim 19 wherein the protective layer is a silicon oxide layer.

34. The method of the claim 19 wherein the conductive layer is used as a source or a drain of a driving transistor of the liquid crystal display panel.

* * * * *